United States Patent
Nakagawa et al.

(10) Patent No.: US 6,566,277 B1
(45) Date of Patent: May 20, 2003

(54) LIQUID-PHASE GROWTH METHOD, LIQUID-PHASE GROWTH APPARATUS, AND SOLAR CELL

(75) Inventors: Katsumi Nakagawa, Atsugi (JP); Shoji Nishida, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 167 days.

(21) Appl. No.: 09/664,340

(22) Filed: Sep. 18, 2000

(30) Foreign Application Priority Data

Sep. 22, 1999 (JP) .......................... 11-269186
Sep. 12, 2000 (JP) .......................... 2000-276792

(51) Int. Cl.$^7$ ............................................. H01L 21/30
(52) U.S. Cl. .................. 438/761; 438/758; 438/763; 438/764; 438/767; 438/789; 438/514; 438/517; 438/500; 118/58; 118/415; 118/429; 257/410; 257/321
(58) Field of Search .................. 438/766, 758, 438/761, 763, 764, 767, 789, 514, 517, 500; 257/410, 321; 118/58, 415, 429

(56) References Cited

U.S. PATENT DOCUMENTS

| | | | | |
|---|---|---|---|---|
| 3,648,654 A | * | 3/1972 | Bergh ........................ | 118/429 |
| 3,665,888 A | * | 5/1972 | Bergh et al. ................ | 118/415 |
| 4,243,472 A | | 1/1981 | O'Neill ...................... | 156/624 |
| 4,350,116 A | | 9/1982 | Grandia et al. ............. | 118/500 |
| 5,326,719 A | | 7/1994 | Green et al. ................ | 437/119 |
| 5,575,862 A | | 11/1996 | Nishida ...................... | 136/258 |
| 5,584,941 A | * | 12/1996 | Nishida ...................... | 136/258 |
| 5,667,597 A | * | 9/1997 | Ishihara ...................... | 136/258 |
| 5,773,335 A | * | 6/1998 | Chao .......................... | 438/199 |
| 5,950,081 A | * | 9/1999 | Chang ................. | 148/DIG. 26 |
| 5,989,950 A | * | 11/1999 | Wu ............................ | 438/228 |
| 6,010,797 A | * | 1/2000 | Tomita et al. .............. | 257/410 |
| 6,100,165 A | * | 8/2000 | Sakaguchi et al. .......... | 438/406 |
| 6,100,166 A | | 8/2000 | Sakaguchi et al. .......... | 438/455 |
| 6,180,497 B1 | * | 1/2001 | Sato et al. .................. | 438/458 |
| 6,190,937 B1 | * | 2/2001 | Nakagawa et al. | |
| 6,387,780 B1 | * | 5/2002 | Nishida ....................... | 117/60 |
| 6,424,008 B1 | * | 7/2002 | Yamazaki et al. .......... | 257/316 |
| 6,429,035 B2 | * | 8/2002 | Nakagawa et al. ......... | 438/478 |

FOREIGN PATENT DOCUMENTS

| | | |
|---|---|---|
| EP | 0 851 513 | 7/1998 |
| EP | 0 867 918 | 9/1998 |
| JP | 58-15218 | 1/1983 |
| JP | 10-189924 | 7/1998 |
| WO | 97/09738 | 3/1997 |

OTHER PUBLICATIONS

Patent Abstracts of Japan, vol. 007, No. 088 (E–170), Apr. 12, 1983 (corresponds to JP 58–015218).

* cited by examiner

Primary Examiner—Matthew Smith
Assistant Examiner—V. Yevsikov
(74) Attorney, Agent, or Firm—Fitzpatrick, Cella, Harper & Scinto

(57) ABSTRACT

The present invention provides a method for producing a semiconductor substrate which comprises the steps of growing a first semiconductor layer on a substrate in liquid phase at a properly controlled temperature for eliminating defects and growing a second semiconductor layer on the first semiconductor layer in liquid phase at a higher temperature; a solar cell produced by a method comprising a step of anodizing the surface of the first and second layer side of the semiconductor substrate produced by the liquid-phase growth method; a liquid-phase growth apparatus comprising means for storing a melt, means for changing the temperature of the stored melt, and means for bringing an oxygen-containing substrate into contact with the melt, wherein a substrate is brought into contact with the melt at a temperature so as to suppress the stacking faults contained in the semiconductor layer grown on the surface of the substrate.

18 Claims, 9 Drawing Sheets

LIQUID-PHASE GROWTH METHOD, LIQUID-PHASE GROWTH APPARATUS, AND SOLAR CELL

BACKGROUND OF THE INVENTION

1. Field of the Invention

The present invention relates to a liquid-phase growth method and a liquid-phase growth apparatus for growing a semiconductor layer on an oxygen-containing substrate and relates to a solar cell.

2. Related Background Art

Recently, a solar cell has widely been employed for an independent power source to drive various kinds of electronic appliances and apparatuses and also for a power source systematically interrelated with commercial power source. Generally, silicon and gallium arsenide are used for a semiconductor constituting a solar cell. In order to obtain high photoelectric conversion efficiency (efficiency of the conversion of light energy into electric energy), their single crystals or polycrystals are preferable.

It has also recently been recognized that use of an epitaxial silicon substrate is extremely preferable to fabricate a bipolar LSI and a CMOS-LSI. First of all, independent control of impurity concentration in a bulk part and an epitaxial layer (an active layer) can easily be carried out in an epitaxial substrate. Respective transistors of a bipolar LSI can easily be shut from one another and electric interference among respective transistors can be prevented by utilizing such a characteristic. The latch up phenomenon of a CMOS-LSI can be prevented, too.

Further, since an epitaxial substrate scarcely has as-grown defects, which are sometimes observed in a conventionally used silicon substrate grown by the Czochralski process, a device with improved dielectric strength of an oxide film and with high reliability can be fabricated in the case of a CMOS-LSI. Also, since heavy metal impurity removal is remarkably efficiently carried out for an epitaxial substrate using a substrate containing boron (B) in a high concentration by gettering treatment, a device fabricated using the epitaxial substrate has been known to be generally provided with excellent performance characteristics.

Moreover, in the case of application to a solar cell and an epitaxial substrate, a silicon layer with 10 μm to 100 μm thickness is often required and it is possible to provide an epitaxial layer with such a thickness by a CVD method. However, the number of substrates to be loaded per a batch is limited or a maintenance work of the apparatus to be employed is required after every batch and the production throughput is thus low.

In order to heighten the production throughput, silicon layer growth by a liquid-phase growth is advantageous. Detailed description of solar cell fabrication by liquid-phase growth is described in Japanese Patent Application Laid-Open No. 10-189924. The technique is basically applicable not only to a solar cell but also to production of an epitaxial substrate, but in the present state, it still leaves much room for improvement in the defect density of a grown silicon layer and the life time of minority carriers.

By a conventional technique, a crystal is grown on a substrate by melting a metal with a relatively low melting point such as indium, gallium, tin, aluminum, copper, or the like, dissolving a semiconductor raw material such as silicon or the like in the melted metal to form a solvent (hereafter called as "melt"), immersing a substrate in the melt, and precipitating the oversaturated semiconductor raw material on the substrate. In order to grow a thick film at a high speed, it is necessary to previously dissolve a semiconductor raw material as much as possible in the melt.

Generally, the solubility of a solid in a liquid becomes higher as the temperature is higher. For that, in the case indium having a low melting point and capable of growing a silicon crystal with high quality is selected among the metals usable as a melt, it is difficult to carry out crystal growth at a rate of 0.1 μm/minute or more when a melt temperature is lower than 750° C., thereby sometimes resulting in hindrance to production of a solar cell and an epitaxial substrate required to have a thick epitaxial layer. In order to heighten the throughput for mass production, it is desirable that the temperature of the melt is set to, e.g., 850 to 1,050° C.

A silicon wafer produced by the Czochralski (Cz) process is widely used for producing an epitaxial substrate. Since such a Cz silicon wafer is produced by heating silicon in a crucible made of quartz glass at a high temperature not lower than 1,400° C. to melt silicon, the silicon wafer inevitably contains excess oxygen.

FIG. 7A is a cross-sectional view showing a substrate 200 containing oxygen 201. Like that, oxygen 201 is consequently contained in the substrate 200 and owing to that, the resultant silicon crystal is provided with an advantage that viscosity is improved to prevent damage on the substrate during the production process. Further, oxygen 201 is said to work as a gettering sink and to lower bad effects of contamination with heavy metal atoms and there are other advantage such as low cost.

However, regarding the Cz wafer, the quality of the grown epitaxial film on the Cz wafer is sometimes deteriorated due to the contained oxygen. FIG. 8 shows microscopic photographs of the surfaces of a Cz silicon substrate with (111) plane orientation taken after heating the substrate for a predetermined time and then chemically etching the resultant substrate (cited from Fumio Shimura: "Semiconductor Silicon Crystal Engineering", published by Maruzen, FIG. 6.58). As expected from FIG. 8, as the temperature of the melt increases, the density of actual defects is increased and at 750° C. or higher, the density is sharply increased.

This is, as shown in FIG. 7B, because oxygen 201 contained in the substrate 200 is precipitated and appears as defects 202 by treating the substrate 200, for example, in a melt at 750° C. or higher. The defects 202 appearing on the surface of the substrate 200 can be cores of stacking faults 204 caused in a semiconductor layer 203, so that the epitaxial layer formed thereon possibly contain a large number of stacking faults 204 (FIG. 7C).

A stacking fault 204 is known to deteriorate various characteristics of a semiconductor device and highly harmful for application to a solar cell as well as for application to an epitaxial substrate. Thus, there is a problem that if the temperature of the melt is increased to obtain a practical growth rate of an epitaxial film, the quality of the epitaxial layer has to be sacrificed.

Further, an epitaxial growth apparatus to be employed at a high temperature such as a CVD apparatus and a liquid-phase growth apparatus generally comprises main parts such as a reaction tube, a crucible, or the like made of quartz glass, and however these members contain heavy metals in a small amount. The heavy metals in constituent members of an electric furnace are said to permeate the tubular wall of a reaction tube at a high temperature.

Moreover, metallic materials such as a stainless steel are inevitably to be used for members such as pipes and valves to which heavy load is applied in a large scale apparatus for mass production. For that, during the period from the time when a substrate is loaded in an apparatus to the time of starting epitaxial growth, the surface of the substrate may be polluted with heavy metal atoms. Furthermore, heavy metal atoms such as iron, chromium, copper or the like are agglomerated with the lapse of time and defects 403 of such as silicides are caused in the surface of the substrate 200 (FIG. 9C). That is illustrated in FIG. 9A to FIG. 9C.

In the case epitaxial growth is carried out on the substrate 200 polluted with the heavy metal atoms 401, 402, the defects 403 become cores and may cause stacking faults 405 in the resultant epitaxial layer 404 or the heavy metal atoms 406 may be diffused in the epitaxial layer 404 (FIG. 9D). The stacking faults 405 and the diffused heavy metal atoms 406 considerably deteriorate the quality of the epitaxial layer 404.

SUMMARY OF THE INVENTION

It is an object of the present invention to grow a semiconductor layer with extremely few defects even if a substrate contains oxygen.

It is another object of the present invention to grow a semiconductor layer with extremely few defects even if the substrate surface is polluted.

According to the present invention, there is provided a method for producing a semiconductor substrate, which comprises the steps of growing a first silicon layer on a silicon substrate in liquid phase at a temperature lower than 750° C. and growing a second silicon layer on the first silicon layer in liquid phase at a temperature not lower than 750° C.

According to the present invention, there is provided a solar cell produced by a method comprising a step of anodizing a surface of the first and second silicon layer side of the above-described semiconductor substrate.

According to the present invention, there is a liquid-phase growth method for growing a semiconductor layer on a substrate containing oxygen, which comprises growing a first semiconductor layer by bringing the substrate into contact with a melt at a temperature such that defects due to the oxygen are suppressed to be less than $1000/cm^2$ on a surface of the substrate.

According to the present invention, there is provided a liquid-phase growth apparatus for producing the above-described semiconductor substrate, comprising means for storing a melt in which silicon is melted, means for changing a temperature of the melt, and a holding member for simultaneously holding a semiconductor material to be melted in the melt and the silicon substrate; and means for transporting the holding member up and down.

In order to achieve the foregoing purposes, in the liquid-phase growth method of the present invention for growing a semiconductor layer on an oxygen-containing substrate, a first semiconductor layer is grown by bringing the substrate into contact with a melt at a temperature such that a number of defects derived from oxygen in a surface of the substrate is suppressed to be less than $1000/cm^2$.

A solar cell of the present invention is provided with the first semiconductor layer formed by the above-described liquid-phase growth method.

The method of the present invention for producing an epitaxial substrate comprises using the first semiconductor layer formed by the above-described liquid-phase growth method as an epitaxial layer. Further, the method of the present invention for producing the epitaxial substrate comprises growing a second epitaxial layer at a high speed by bringing the substrate having the first semiconductor layer formed thereon into contact with a melt at a temperature higher than that for formation of the first semiconductor layer.

Moreover, a liquid-phase growth apparatus of the present invention comprises means for storing a melt, means for changing the temperature of the stored melt, and means for bringing an oxygen-containing substrate into contact with the melt, wherein a first semiconductor layer is grown on the substrate by bringing the substrate into contact with a melt at a temperature such that a number of stacking faults contained in the semiconductor layer on the surface of a silicon substrate is suppressed to be less than $1,000/cm^2$.

DESCRIPTION OF THE PREFERRED EMBODIMENT

Hereafter, embodiments of the present invention will be described with reference to the attached drawings.

(Embodiment 1)

Figure 1A:
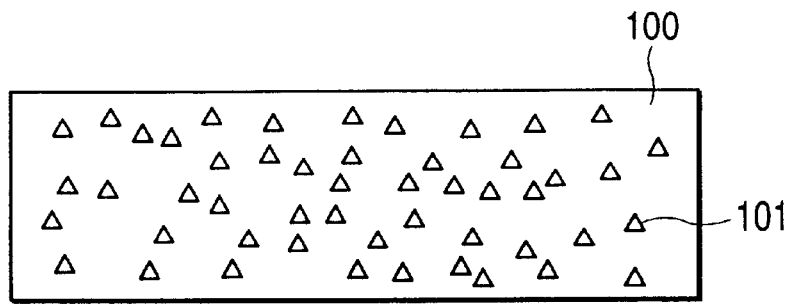
FIGS. 1A, 1B and 1C are cross-sectional views illustrating the principle of liquid-phase growth method of producing a substrate according to Embodiment 1 of the present invention.
Figure 1B:
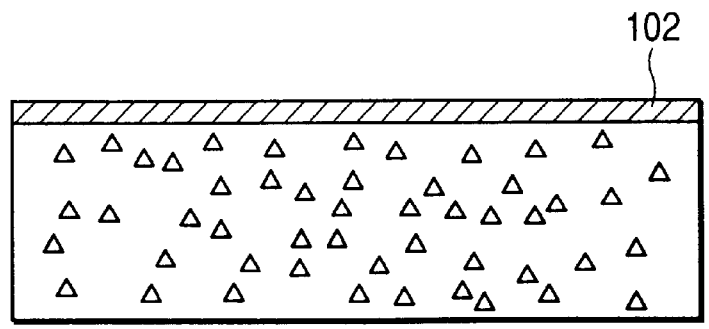
Figure 1C:
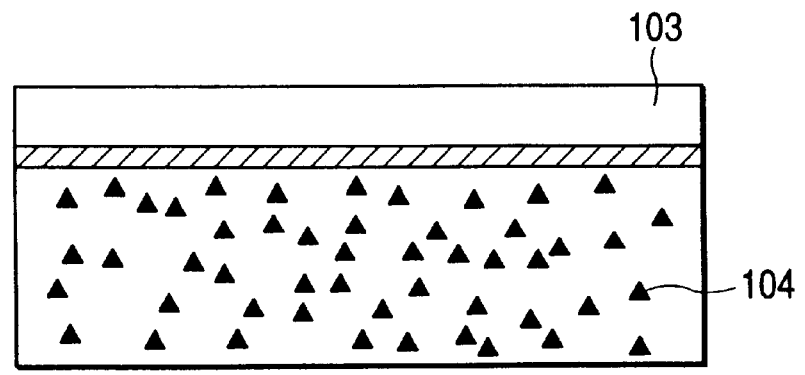

FIGS. 1A to 1C are cross-sectional views illustrating the principle of a liquid-phase growth method of Embodiment 1 of the present invention. As shown in FIGS. 1A to 1C, even if, for example, oxygen 101 is contained in a substrate 100, stacking faults are hardly caused in a first silicon layer 102 since oxygen atoms 101 are hardly transformed into defects 104 in the substrate 100 in the case the first silicon layer 102 is grown on the substrate 100 (FIG. 1B) under the condition that the temperature of a melt containing silicon (a semiconductor) is kept lower than, for example, 750° C. in a solution of a low melting point metal such as indium, gallium, tin, aluminum, copper or the like.

Generally, in the case the stacking fault number is less than $1000/cm^2$, the crystal is regarded as a high quality crystal. It is therefore sufficient to grow the first silicon layer 102 at a temperature such that the stacking fault number is suppressed to be less than 1000/cm². This temperature is found to be lower than 750° C. by experiments. The lower limit of the growth temperature may be optional as long as it is suitable to make liquid-phase growth possible and preferably 500° C. or higher.

Next, a second silicon layer 103 is formed at, for example, a temperature of not lower than 750° C. Consequently, the growth rate of the silicon layer is heightened to 0.1 μm/minute or higher, and mass production of solar cells and epitaxial substrates bearing thick epitaxial layers easily becomes possible.

In the case the temperature of the substrate 100 is increased to, for example, 750° C. or higher, though defects 104 owing to oxygen 101 appear in the inside of the substrate 100, the first silicon layer 102 functions as a buffer layer to present effects of defects 104 from appearing on the surface of the second silicon layer 103.

On the other hand, since the content of oxygen in the first silicon layer 102 is generally lower than that of the substrate 100 by two orders of magnitude, even if the temperature of the melt for growing a second silicon layer 103 is increased to 750° C. or higher, defects scarcely appear in the first silicon layer 102. In order to grow the first and the second silicon layers 102, 103 on the substrate 100 in the foregoing procedure, for example, a melt in which silicon is saturated at, for example, a temperature lower than 750° C. and another melt in which silicon is saturated, for example, at a temperature not lower than 750° C. are prepared and then a substrate 100 is immersed successively in these melts.

Figure 2A:
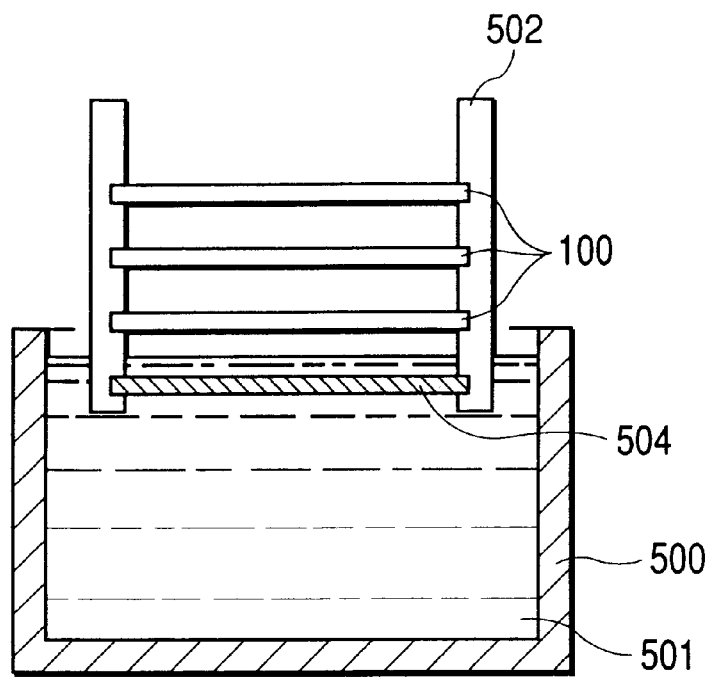
FIGS. 2A and 2B are cross-sectional views showing a liquid-phase growth apparatus for producing the substrate of FIGS. 1A to 1C.
Figure 2B:
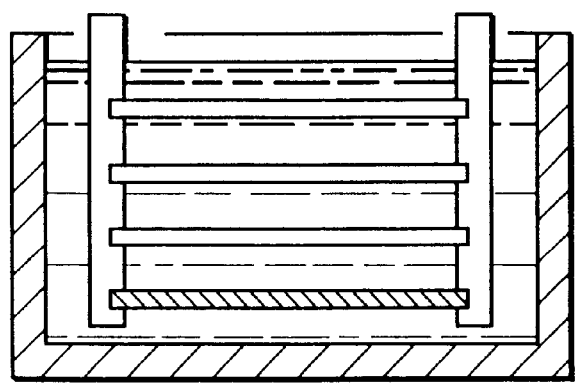

FIGS. 2A and 2B are cross-sectional views showing a liquid-phase growth apparatus of Embodiment 1 of the present invention. As shown in FIGS. 2A and 2B, a melt 501 of indium, tin, or the like is poured in a crucible 500 made of quartz glass of a carbon material. A substrate 504 for dissolving silicon and the like in the melt 501 and the substrates for growth 100 are installed in substrate holding means 502 having grooves capable of holding the substrates 100 wherein the grooves are formed at constant intervals. The interval of the neighboring grooves formed in the substrate holding means 502 is preferably, for example, 0.5 to 1.5 cm. In order to improve the throughput per a batch, the interval is preferably narrow, and in order to bring the melt into sufficient contact with the substrates, the interval is preferable not to be narrow too much. For those reasons, the above defined intervals were confirmed to be preferable from experiments.

The substrate holding means 502 can hold the substrates 100 and the substrate for dissolution 504 at optional positions in the melt 501. Additionally, the crucible 500 and the substrate holding means 502 are housed in a reaction furnace which is not shown in the drawings and kept in hydrogen gas flow in order to prevent oxidation. Moreover, the melt 501 is controlled by an electric furnace which is not shown in the drawings and kept at a constant temperature.

The following is description of the use method of the apparatus. At first, the substrate for dissolution 504 is installed in grooves, for example, in the lowest stage of the substrate holding means 502 and the substrates 100 are installed in the grooves of above stages. The melt 501 is then kept at a temperature lower than 750° C. by an electric furnace and the substrate holding means 502 are so lowered as to immerse the substrate for dissolution 504 in the melt 501 without immersing the substrates 100, whereby silicon is consequently melted into the melt 501 from the substrate for dissolution 504.

Since the portion with a higher silicon concentration in the melt 501 has a smaller specific gravity than other portions, it moves toward the surface of the melt 501. For this reason, silicon tends to exist unevenly near the surface of the melts 501. The melt 501 is, therefore, sufficiently stirred by melt stirring means which is not shown in the drawings to make the silicon concentration even in the whole melt 501.

After the silicon concentration is made even, the melt 501 is cooled by about 5 to 30° C. Consequently, silicon is kept in oversaturated state in the melt 501. After that, the substrate holding means 502 are lowered to immerse also the substrates 100 in the melt 501. In such a manner, a first silicon layer 102 is grown on the surfaces of the substrates 100. Then, the substrate holding means 502 are moved up to pull only the substrates 100 out of the melt 501, while the substrate for dissolution 504 is kept in the melt 501.

In this case, since it is enough for the first silicon layer 102 to be grown to about 0.01 μm thickness, even if the temperature of the melt 501 is lower than 750° C., it takes only about 10 minutes to grow the first silicon layer 102.

Next, the temperature of the melt 501 is increased to, for example, 750° C. or higher, preferably 850 to 1050° C., and silicon is dissolved from the substrate 504 in the melt 501. Then, the melt 501 is cooled by 5 to 30° C. to saturate the melt 501 with silicon again.

The substrates 100 are again immersed in the melt 501 to grow a second silicon layer 103. Following the temperature increase of the melt 501, the concentration of silicon in the melt 501 is heightened and consequently, growth rate of silicon is increased. As a result, the time required to form a second silicon layer 103 with 10 to 100 μm thickness is within one hour. Additionally, the thickness of the first silicon layer 102 is sufficient as long as the first silicon layer functions as a buffer layer as described above and preferably to be 0.01 μm to 1 μm.

(Embodiment 2)

The method for eliminating effects of not only oxygen but also heavy metal pollution on the substrate will be described.

Figure 3A:
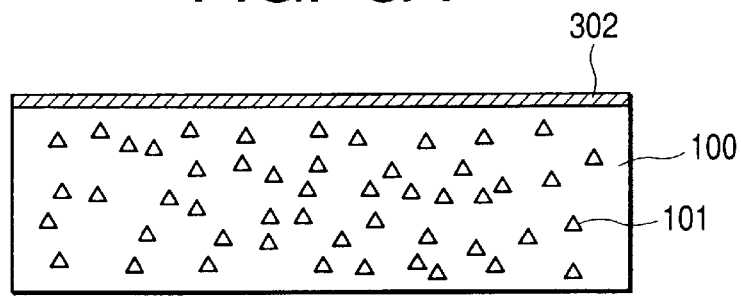
FIGS. 3A, 3B, 3C and 3D are cross-sectional views showing heavy metal atoms adhering to the surface of the substrate and the steps of removing them.

FIGS. 3A to 3D are illustrations showing the procedure of growing a silicon layer on a substrate 100 whose surface is polluted with heavy metals 302. An apparatus illustrated in FIGS. 2A and 2B is employed for the liquid-phase growth similarly as in the case of Embodiment 1. As shown in FIG. 3A, heavy metal atoms 302 of such as iron, chromium, copper or the like which penetrate a quartz tube constituting the liquid-phase growth apparatus or are evaporated from metal members constituting the liquid-phase growth apparatus adhere to the surface of the substrate 100.

Figure 3B:
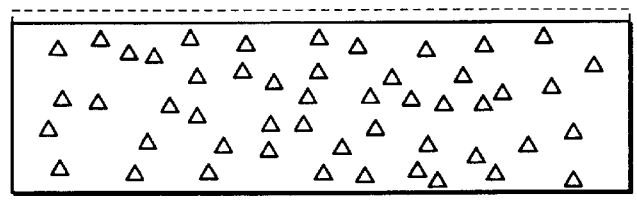

As shown in FIG. 3B, the substrate 100 is, therefore, brought into contact with an unsaturated melt 501 to melt the surface polluted with the heavy metals 302. No need to say, the temperature of the melt at that time is kept at a temperature lower than 750° C. If the substrate 100 is brought into contact with a melt 501 containing no silicon at all, the amount of the silicon to be dissolved becomes too much and the surface of the substrate 100 is roughened, so that it is preferable to previously dissolve a proper amount of silicon in the melt 501. For example, the melt 501 is kept at 600° C. and the substrate 504 is immersed in the melt 501 and after that, the substrate 504 is pulled out of the melt 501 and then the melt 501 is preferably kept at 650° C. In such a manner, the melt 501 is kept in silicon-unsaturated state. Consequently, the smoothness of the surface of the substrate 100 can be kept.

Figure 3C:
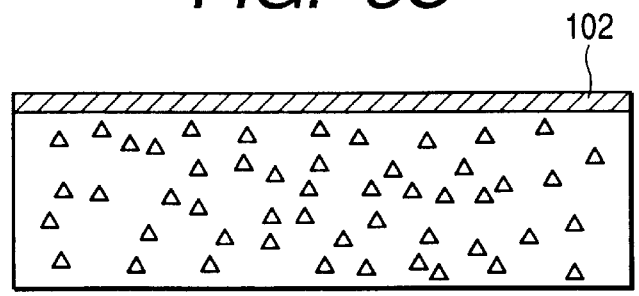
Figure 3D:
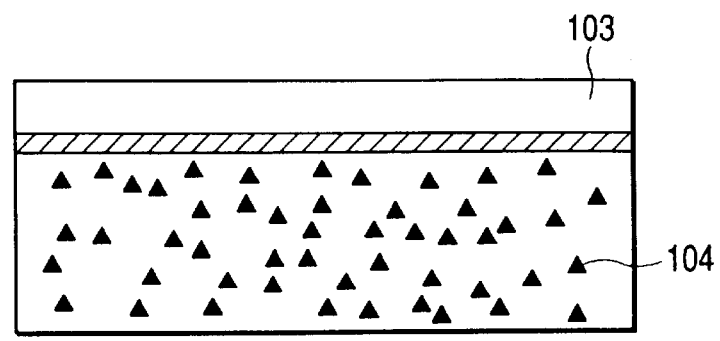

Following that, the substrate 100 is brought into contact with an oversaturated melt at a temperature lower than 750° C. to grow the first silicon layer as shown in FIG. 3C and then further brought into contact with a melt at a temperature not lower than 750° C. to carry out epitaxial growth at a practically high growth rate without being affected with oxygen 101 and the heavy metal atoms 302 contained in the substrate 100.

(Embodiment 3)

According to Embodiment 2, it is required to pull the substrate 100 out of the melt during the time from the immersion of the substrate 100 in the unsaturated melt before the growth of the first silicon layer to the start of the growth. Though the time is short, the surface of the substrate 100 is possibly polluted again during the time.

For that, in the present embodiment, the substrates 100 and the substrate for dissolution 504 are immersed in the melt 501 which is not saturated with silicon at a temperature lower than 750° C. to melt the surfaces of the substrates 100. Then while the substrates 100 is immersed in the melt 501, the temperature of the melt 501 is lowered to saturate the melt 501 with silicon. When the melt 501 is saturated, the first silicon layer 102 is grown on the immersed surfaces of the substrates 100 which are previously melted in the melt. At this time, in order to prevent re-precipitation of heavy metals melted from the surface of the substrates 100 into the unsaturated melt, it is desirable to sufficiently stir the melt so as to remove the melted heavy metals from the peripheries of the surface of the substrates. After that, the substrates 100 each bearing the first silicon layer 102 are immersed in the melt 501 at 750° C. or higher and a second silicon layer 102 is grown at a high rate. At that time, the effects of pollution can be avoided also by carrying out the growth after immersing the substrates in the slightly unsaturated melt 501 and then lowering the temperature of the melt. Even when the temperature of the melt is 750° C. or higher, the bad effects of oxygen 101 contained in the substrates 100 can be avoided as long as the thickness of the first silicon layer 102 is controlled not so as to be 0.01 μm or thinner owing to the melting into the unsaturated melt.

(Embodiment 4)

According to Embodiment 3, bad effects of oxygen 101 and heavy metal atoms 302 contained in the substrate 100 can be avoided, although the substrate 100 is required to be pulled out the melt 501 once during the time after the growth of the first silicon layer 102 and start of the growth of the second silicon layer 103. In order to simplify the process, growth of an epitaxial layer is carried out by immersing the substrate 100 in the melt 501 and increasing the temperature of the melt 501 while keeping the saturated state of the melt 501 with silicon in this embodiment.

Additionally, it is further effective to melt out heavy metal atoms 302 in the melt 501 by bringing the surface of the substrate 100 into contact with the melt 501, which is not saturated with silicon, before the growth of silicon. In this case, also, it is better to keep the melt at a low temperature since once a silicide layer is formed on the surface of the substrate 100, and then the substrate is difficultly dissolved in the melt.

In other words, the amount of silicon melted out of the substrate 100 becomes too much if the substrate 100 is brought into contact with a melt 501 containing no silicon at all, so that a proper amount of silicon is previously melted in the melt 501. It is therefore preferable, for example, that the substrate for dissolution 504 is immersed in the melt 501 while the temperature being kept at 600° C. and then the substrate for dissolution 504 is pulled out the melt 501 and the temperature of the melt 501 is increased to 650° C. The melt 501 is thus kept in silicon-unsaturated state. Consequently, the smoothness of the surface of the substrate 100 can be guaranteed.

FIGS. 3A to 3D illustrate the procedure of growing, for example, a silicon layer on a substrate 100 whose surface is polluted with heavy metals 302 or the like. The surface of the substrate 100 is sometimes possibly polluted by adhesion of heavy metal atoms 302 of such as iron, chromium, copper or the like which penetrate a quartz tube constituting the liquid-phase growth apparatus or are evaporated from metal members constituting the liquid-phase apparatus to the surface of the substrate 100.

The heavy metal atoms 302 form silicides by reaction on silicon when the temperature is high. The silicides sometimes become cores of defects caused in an epitaxially grown semiconductor layer. In order to avoid silicide formation, the temperature of the substrate 100 is better to be kept low as much as possible until start of the growth of the silicon layer. Especially, in consideration of prevention of defects 104 by oxygen 101 in the substrate 100, the temperature of the substrate 100 is preferably suppressed to, for example, be a temperature lower than 750° C.

(Embodiment 5)

The liquid-phase growth method according to the present embodiment will be described below. If possible, it is preferable to increase the temperature of the melt 501 while silicon in the melt 501 being kept in saturated state and the substrate 100 being immersed in the melt 501. That is because the surface of the first silicon layer 102 may possibly be polluted with heavy metal atoms at the time when the substrate 100 is pulled out in the case the substrate is pulled out the melt once after the growth of the first silicon layer 102 and again immersed in the melt, as shown in FIGS. 1A to 1C, and further because defects may be caused in the silicon layer owing to silicide formation by reaction of the heavy metals and silicon when the polluted substrate 100 is immersed again in the melt.

Figure 4:
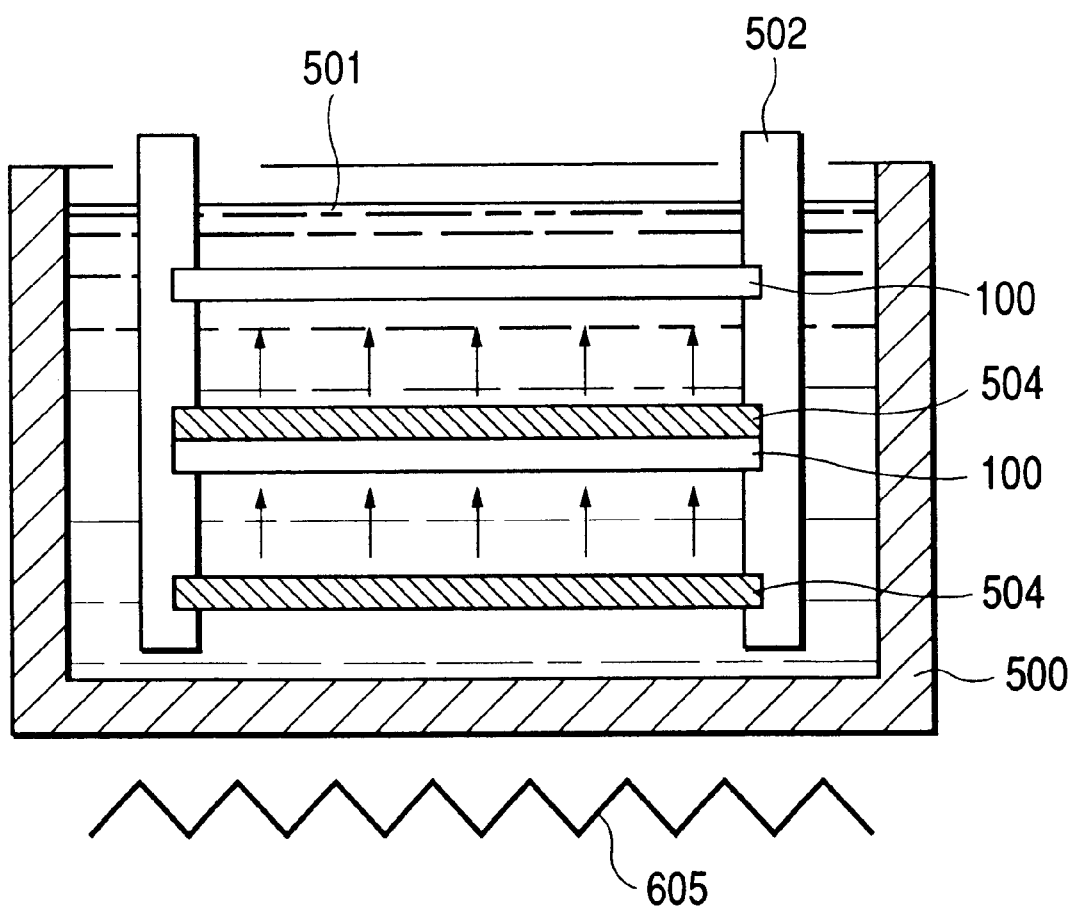
FIG. 4 is a cross-sectional view showing a liquid-phase growth apparatus of Embodiment 4 of the present invention.

FIG. 4 is an illustration of a liquid-phase growth apparatus for performing the present embodiment. The same signs are attached to the same members as those of FIGS. 2A and 2B. In the case there are a plurality of pairs of substrate for dissolution 504 and substrate for growth 100 are employed, it is desirable that the rear sides of the substrates 504 and the substrates 100 are held while being closely attached to each other since growth in unnecessary parts and dissolution from unnecessary parts can be suppressed.

In the apparatus, the melt 501 is at first kept, for example, at a temperature lower than 750° C. and the substrates 504 and the substrates 100 are immersed in the melt 501. At that time, the melt 501 may be saturated or unsaturated with silicon. In the case of unsaturated state, silicon in the peripheries of the surfaces of the substrates 100 is melted out and the pollution of the surfaces with heavy metal atoms 302 can be eliminated.

Soon, silicon starts dissolving out the surfaces of the substrates 504 in the melt 501 and a portion where the silicon concentration becomes high, i.e., a portion where a specific gravity becomes small moves upward. As a result, the silicon concentration is heightened and gets in oversaturated state in the lower faces of the substrates 100 and the silicon layer growth starts.

When the melt 501 is further heated by heating means 605 installed in the bottom face of a crucible 500, the amount of silicon dissolved from the substrates 504 in the melt 501 is increased. On the other hand, the oversaturated state is maintained on the surfaces of the substrates 100 where the silicon concentration is relatively high owing to the specific gravity difference of the melt 501 and whose temperature is lower than that of the substrates 504 set face to face with the substrates 100 and the growth rate is heightened.

With the lapse of time, the temperature of the melt 501 is increased to, for example, 750° C. or higher and if a silicon layer is grown to have a thickness of 0.01 μm or more until the time, even in the case the defects attributed to oxygen 101 appear, the growing silicon layer is not affected with the defects. Moreover, the growth rate can sufficiently be heightened by keeping the melt 501 at 750° C. or higher. After a second silicon layer 103 is formed, the substrate holding means 502 are pulled up to finish the growth of silicon layers.

As described above, the silicon layer growth is described in the present embodiment by using a metal with a relatively low melting point, such as indium, as the melt 501 and employing silicon for dissolution in melt 501 and formation of a semiconductor layer on the surface of a substrate 100. However, the combination of substances for the semiconductor layer formation is not restricted within the exemplified ones and many different combinations and other substances may be allowed.

Also, the description is given using silicon as a material for the substrates 100, the material is not limited to be silicon. In the case a substance other than silicon is used for a substrate, the temperature of a melt 501 will be different from the foregoing temperature. After all, as described at the beginning, it is sufficient to grow the first semiconductor layer at a temperature such that the number of defects appearing on the surface are suppressed to be less than $1000/cm^2$, which is generally the allowable level for a high quality crystal. Further, different substances may be employed for growing the first semiconductor layer and the second semiconductor layer, respectively, by changing the semiconductor materials melted in the melts in two different crucibles.

Hereafter, examples of the present invention will be described with reference to the drawings.

EXAMPLE 1

Figure 5:
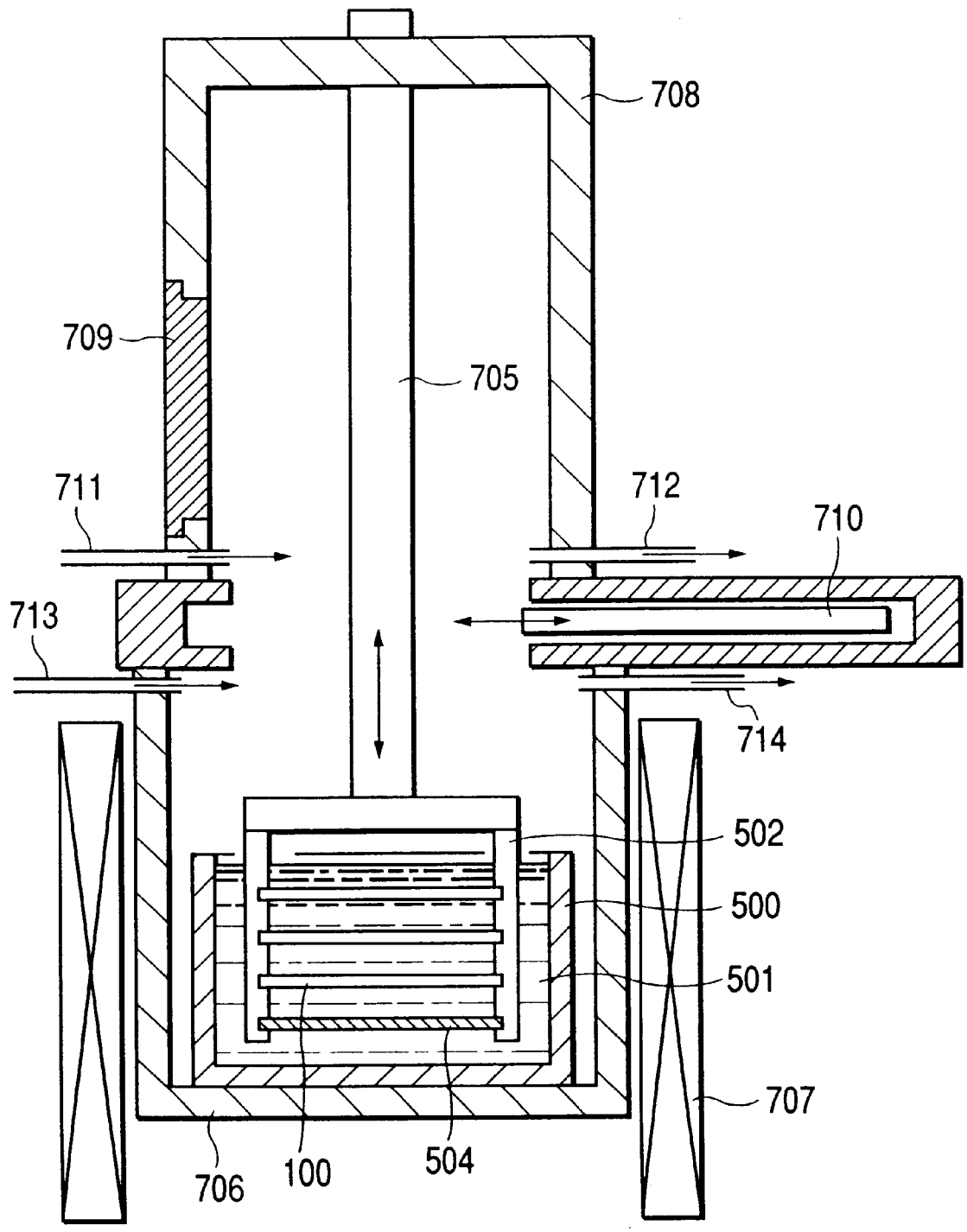
FIG. 5 is a cross-sectional view showing a liquid-phase growth apparatus of Example 1 of the present invention.

FIG. 5 is a cross-sectional view showing a liquid-phase growth apparatus of the present example. The method for producing an epitaxial substrate with extremely few defects by employing the apparatus shown in FIG. 5 will be described below. The same signs are attached to the same members as those described in FIGS. 2A and 2B. At first, in order to replace substrates 100, the substrate holding means 502 were elevated to a load lock chamber 708 and a gate valve 710 partitioning the load lock chamber 708 and the reaction tube 706 made of quartz glass was closed.

After that, nitrogen was introduced through a gas introduction pipe 711 into the load lock chamber 708 to replace the ambient gas in the load lock chamber 708 with nitrogen. Then, a substrate exchange door 709 was opened to hold previously cleaned $p^+$-type silicon substrates 100 with 6 inch φ and surface orientation (100) by the substrate holding means 502. Next, while the load lock chamber 708 being evacuated from a gas introduction pipe 712, hydrogen was introduced into the load lock chamber 708 through a gas introduction pipe 711 to replace the ambient gas of the load lock chamber 708 with hydrogen.

On the other hand, a melt 501 of indium in which silicon was previously melted to be saturated at, for example, 600° C. was kept at 650° C. in a crucible 500 by an electric furnace 707. Further, in order to prevent oxidation of the melt 501 and the substrates 100, hydrogen gas was introduced into the reaction tube 706 while the reaction tube being evacuated through a gas discharge pipe 714, and the inside of the reaction tube 706 was kept at about atmospheric pressure.

The gate valve 710 was opened, a substrate elevating mechanism 705 was operated, the substrate holding means 502 were lowered to the position above the crucible 500 and kept as they were until the temperature of the reaction tube 706 became the same temperature as that of the melt 501. Then, the substrates 100 and the substrates 504 were immersed in the melt 501 and kept for 5 minutes to slightly melt the surfaces of the substrates 100 in the melt 501.

After that, the substrates 100 were once pulled out the melt 501 and kept for 30 minutes as they were and silicon was dissolved out of the substrates 504 in the melt 501. During that time, the melt was continuously stirred by melt stirring means, which was not shown in the drawings, to evenly saturate the whole melt 501.

Following that, the temperature of the melt 501 was gradually cooled at −0.5° C./minute to make the melt 501 oversaturated and when the temperature reached 635° C., the substrates 100 and the substrates 504 were immersed again in the melt 501 and kept in the melt for 10 minutes to grow a first silicon layer 102. The substrates 100 and the substrates 504 were again pulled out from the melt 501 and the melt 501 was heated, for example, to 950° C.

In such a situation, only the substrates 504 were immersed in the melt 501 and kept for 30 minutes to dissolve silicon from the substrates 504 in the melt. During that time, the substrate holding means 502 were rotated 10 times per a minute and the melt 501 was stirred by the melt stirring mechanism installed in the substrate holding means 502 to make the concentration of the silicon in the melt even.

Next, the melt 501 was gradually cooled at −1° C./minute to be oversaturated and when the temperature reached, for example, 935° C., the substrates 100 and the substrates 504 were immersed again in the melt 501 and kept in the melt for 30 minutes to grow a second silicon layer 103. After that, the substrate holding means 502 were then elevated to the load lock chamber 708 and the gate valve 710 was closed and the substrates 100 were cooled and after nitrogen was introduced into the chamber through the gas introduction pipe 711, the substrate exchange door 709 was opened and the substrates 100 were taken out of the liquid-phase growth apparatus.

No melt 501 was found remaining in the resultant substrates 100, on which silicon layers were thus formed, by visual observation. The substrates 100 were immersed in hydrochloric acid to remove remaining metals for assurance.

To evaluate the defects on the surfaces of the substrates 100 on which growth had been completed, SECCO etching was carried out to visualize the defects as pits and the stacking faults was sought by a metal microscope to find that the number of stacking faults having characteristic square shapes on the substrates was about 1 to $2/cm^2$.

The average surface roughness measured by a surface roughness meter was 5 nm or less. For comparison, in the case only a second silicon layer was grown at, for example, 935° C. without growth of a first silicon layer by the same liquid-phase growth apparatus, it was observed that the number of stacking faults on the surface of the silicon layer was $10^3/cm^2$ on the average. The surface roughness was about 20 nm.

Incidentally, the conductivity type (p- or n-type) of the first and the second silicon layers may be exchanged, and the impurity concentration of their layers may be changed.

EXAMPLE 2

In the present example, it will be described to apply the method of the present invention to the method for producing a thin film crystal silicon solar cell just like the one described in Japanese Patent Application Laid-Open No. 10-189924.

Figure 6:
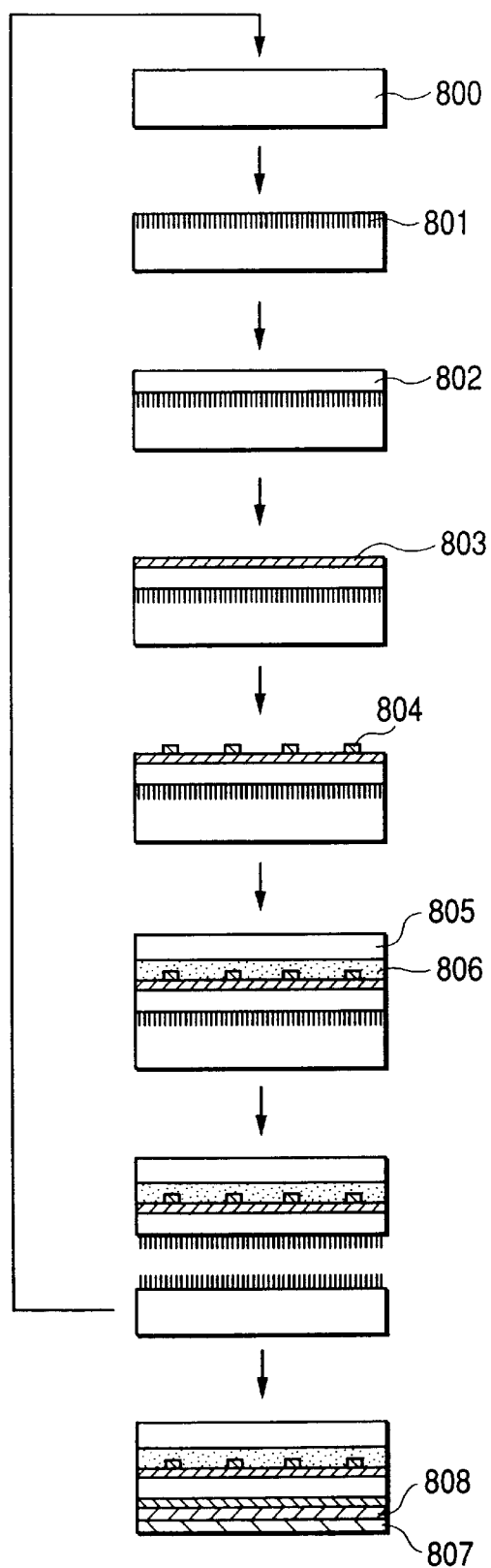
FIG. 6 is a schematic diagram showing the production steps of a thin-film crystal silicon-type solar cell of Example 2 of the present invention.
Figure 7A:
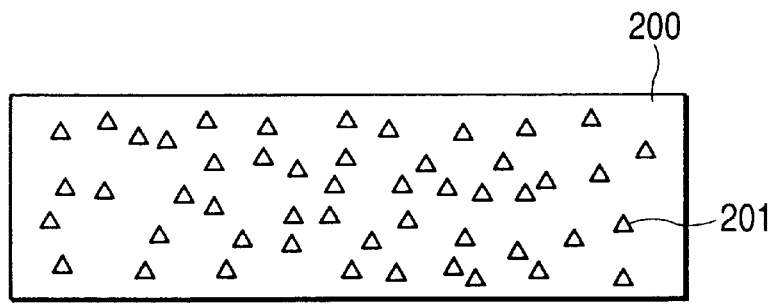
FIGS. 7A, 7B and 7C are cross-sectional views showing the production steps of a substrate produced by a conventional liquid-phase growth method.
Figure 7B:
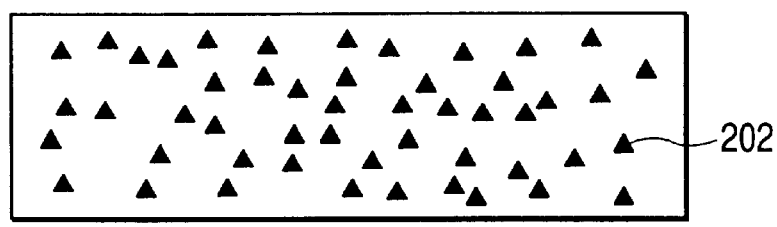
Figure 7C:
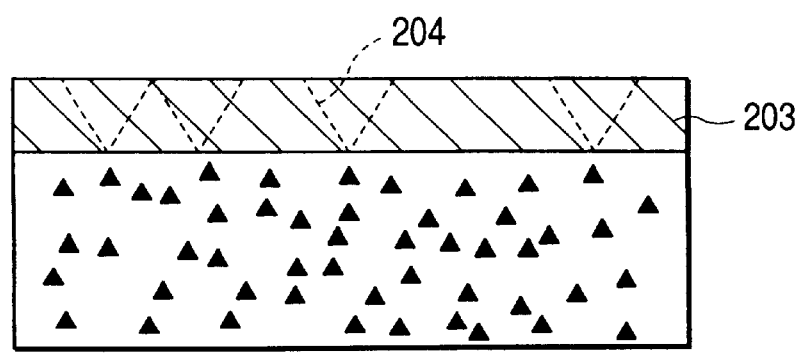
Figure 8:
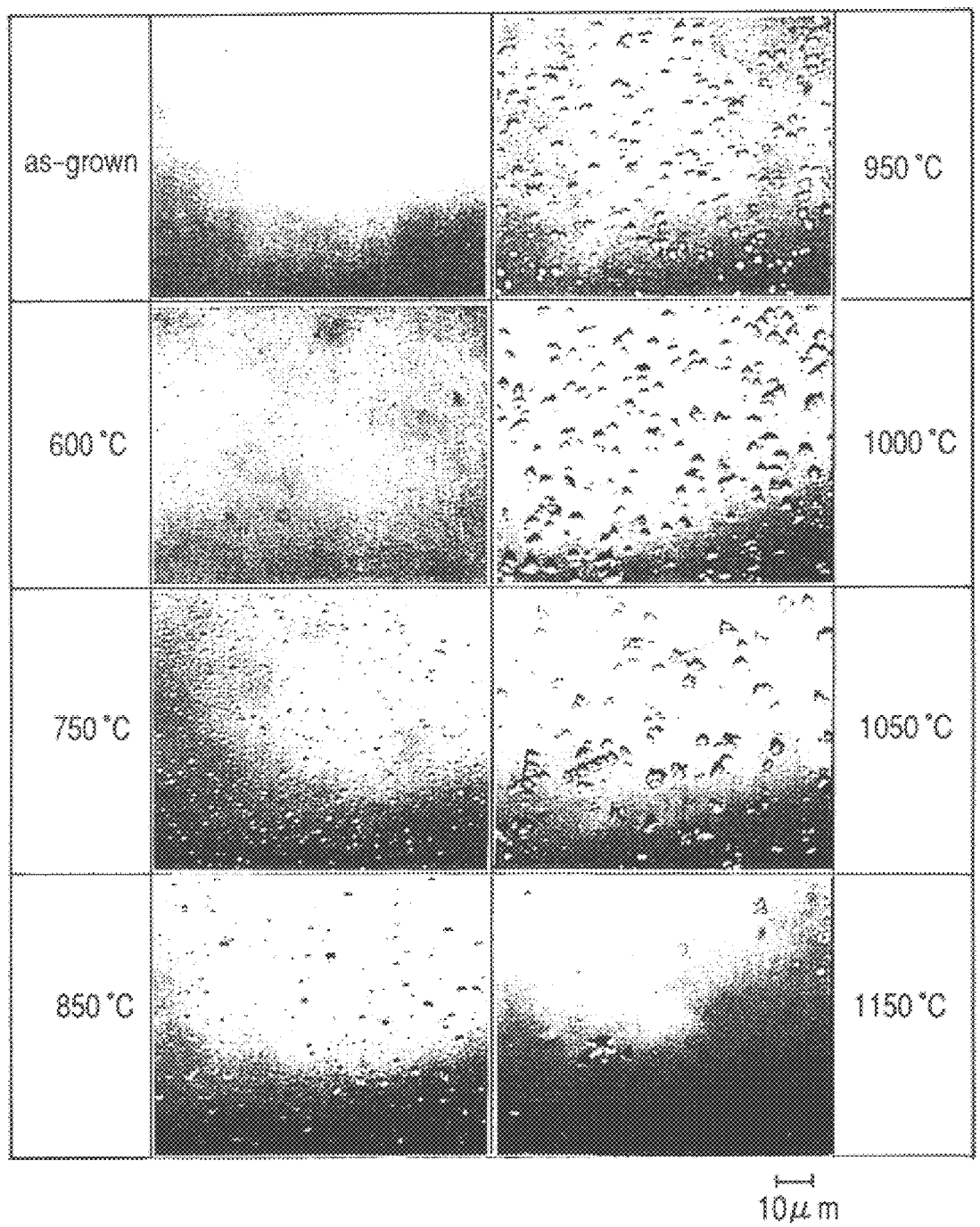
FIG. 8 is a photograph showing states of generation of defects on a substrate surface by heat treatment at various temperatures.
Figure 9A:
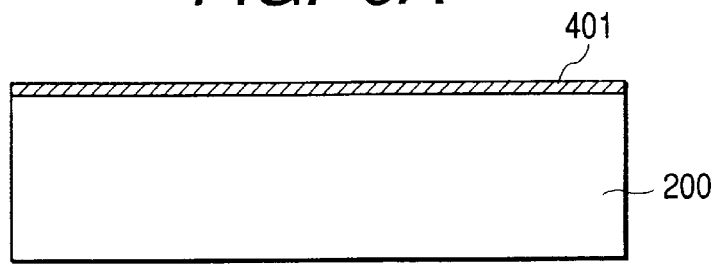
FIGS. 9A, 9B, 9C and 9D are cross-sectional views showing a state of growing a silicon layer in and on the surface of a conventional substrate while heavy metal atoms adhering to the substrate.
Figure 9B:
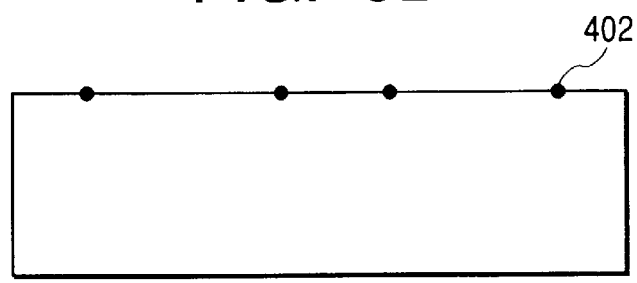
Figure 9C:
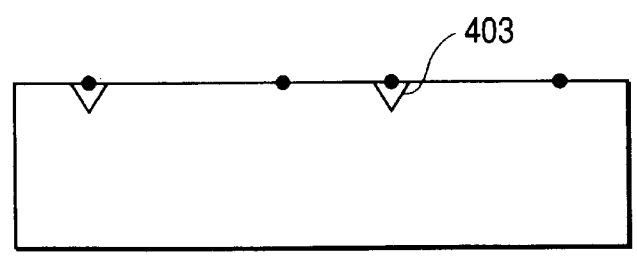
Figure 9D:
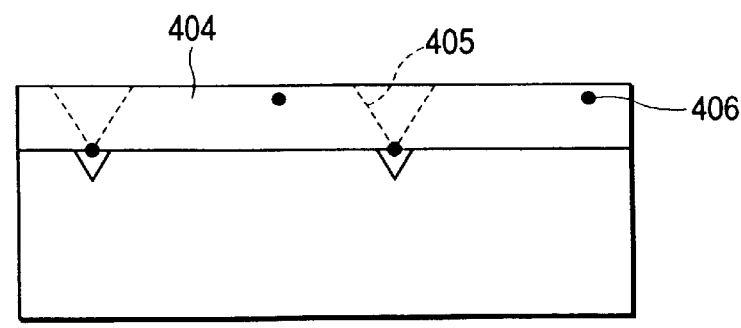

FIG. 6 is a schematic diagram of production of a thin film crystal silicon-type solar cell. At first, a substrate 800 of p$^+$-type silicon with about 0.01 Ωcm specific resistance and a platinum electrode with the same size (not shown in the drawings) were set on the opposite to each other at 5 cm gap and held in a tray (not shown) made of Teflon.

The tray was filled with a mixed solution of hydrofluoric acid and ethanol and electric potential was applied to them while the substrate 800 being set as anode for anodization to form a porous layer 801 in which fine pores with about several 100 Å in diameter were complicatedly entangled in the surface of the substrate 800. Subsequently, the substrate 800 was heated to 1000 to 1100° C. in hydrogen flowing atmosphere and left for about 10 minutes to modify the surface of the porous layer 801. A p$^-$silicon layer 802 was formed on the resultant surface. In order to obtain a practical growth rate of p-silicon layer 802, it was preferable to carry out the silicon layer formation at 850° C. or more. Next, a diffusing agent containing phosphorus was applied to the p$^-$-type silicon layer 802 and the substrate was set in a diffusion furnace to carry out thermal diffusion at 800 to 1000° C. in nitrogen atmosphere, whereby the surface become a n$^+$-type silicon layer 803 to form a semiconductor junction.

Further, a silver paste was printed in a comb-like pattern on the surface and sintered to form a grid electrode 804. In order to suppress the surface recombination, a passivation layer (not shown in the drawings) was formed in the surface of the n$^+$-type silicon layer 803. After that, a transparent supporting member 805 of such as polycarbonate was stuck to the surface with a transparent adhesive 806.

Next, the porous layer 801 which was made fragile by formation of the fine pores was broken by applying force to the transparent supporting member 805 such that peel off the member from the substrate 800, whereby the p$^-$-type silicon layer 802 was peeled off from the substrate 800. A back side electrode 807 was stuck to the back side of the peeled p$^-$-type silicon layer 802 by a conductive adhesive 808 to give a thin film crystal silicon solar cell.

Since the substrate 800 from which the p$^-$-type silicon layer 802 was peeled off could repeatedly be used by removing the remaining porous layer 801 by etching, a large number of thin film crystal silicon solar cell could be produced by using one substrate 800.

Generally, a Cz substrate, which is economical but contains oxygen in high content, is frequently used as the substrate 800 of silicon to be used for above described processes. As described above, since the processes of producing a thin film crystal silicon solar cell comprises the step of heating the substrate 800 at about 800 to 1100° C. for modification of the surface of the porous layer 801 and thermal diffusion, oxygen latently existing in the substrate 800 gradually appeared as defects after repeated use of one Cz substrate.

In the case the defects appeared, at the time when anodization process was carried out in the next process, the formation of the porous layer 801 was locally interfered and defects were caused in the p$^-$-type silicon layer 802 grown on the porous layer. For that, if one substrate 800 was repeatedly used, the characteristics of the produced thin film crystal silicon solar cell tended to be gradually deteriorated. The Cz substrate containing oxygen in a high content was, however, a moderately fragile, as a specific property of a single crystal, and was provided with an advantageous point that the substrate 800 was hardly broken at the time when the porous layer 801 was broken by applying force and the p$^-$-type silicon layer 802 was peeled off from the substrate 800.

By the foregoing technique, while effectively utilizing the characteristics of the Cz substrate with moderately fragile, the increase of defects attributed to repeat use of the substrate 800 was suppressed and consequently, deterioration of the characteristics of the obtained solar cells was prevented. That is, a p$^+$-type silicon layer with a low oxygen concentration was previously grown without containing defects on the surface of Cz substrate by liquid-phase growth method and the porous layer 801 was formed in the p$^+$-type silicon layer.

Next, it will be described to produce the thin film crystal silicon solar cell using the apparatus shown in FIG. 5 by the above described procedure. At first, the substrate holding means 502 were elevated to a load lock chamber 708 and a gate valve 710 was closed. The ambient gas in the load lock chamber 708 was replaced with nitrogen, the substrate exchange door 709 was opened, and a size of 6 inch φ Cz silicon wafer with a specific resistance of 1 Ωcm and surface orientation as the substrate 100 was held by the substrate holding means 502.

A p$^+$-type substrate for dissolution 504 was held in the lowest positions of the substrate holding means 502. A melt 501 of indium in which silicon was previously melted to be saturated at 600° C. was heated and kept at 650° C. in the crucible 500 by the electric furnace 707.

Then, the gate valve 710 was opened, the substrate elevating mechanism 705 was operated, the substrate holding means 502 were kept above the crucible 500 until the temperature of the reaction tube 706 became the same as that of the melt 501. After that, the substrate 100 and the substrate for dissolution 504 were immersed in the melt 501 and kept for 5 minutes to melt the surface of the substrate 100 in the melt 501.

Subsequently, the substrate 100 was once pulled out from the melt 501 and the temperature of the melt 501 was increased to 700° C. and kept for 30 minutes to melt silicon from the substrates 504 into the melt 501. During that time, the melt was continuously stirred by melt stirring means, which was not shown, to evenly saturate the whole melt 501.

Following that, the temperature of the melt 501 was gradually cooled at −0.5° C./minute to make the melt 501 oversaturated and when the temperature reached 685° C., the substrate 100 and the substrate for dissolution 504 were immersed again in the melt 501 and kept in the melt for 10 minutes to grow a first silicon layer 102. The substrate 100 and the substrate for dissolution 504 were again pulled out from the melt 501 and the melt 501 was heated to 1000° C.

In such a situation, only the substrates 504 were immersed in the melt 501 and kept for 30 minutes to dissolve silicon from the substrate 504 into the melt. During that time, the substrate holding means 502 were rotated 10 times per minute and the melt 501 was stirred by the melt stirring mechanism installed in the substrate holding means 502 to make the concentration of the silicon in the melt even.

Next, the melt 501 was gradually cooled at −1° C./minute to be oversaturated and when the temperature reached 985° C., the substrate 100 and the substrate 504 were immersed again in the melt 501 and kept in the melt for 2 hours to grow a second silicon layer 103. The substrate holding means 502 were then elevated to the load lock chamber 708 and the gate valve 710 was closed and the substrate on which the first silicon layer 102 and the second silicon layer 103 were layered was taken out.

No melt 501 was found remaining on the resultant substrate by visual observation and, by way of caution, the substrate was immersed in hydrochloric acid to remove remaining metals.

The grown silicon layer was p-type and had approximately 0.01 Ωcm specific resistance. Generally, a $p^+$-type substrate with a specific resistance of 0.01 to 0.02 Ωcm may be used for formation of the porous layer, however, in the case the substrate surface in which anodization reaction is carried out has a desired resistance value, even if the substrate itself does not have the above-mentioned low specific resistance just like in the case of this example, an economical $p^-$-type substrate 100 with a specific resistance of 0.1 to 10 Ωcm may be employed. Also, since the substrate is used after the thickness of the substrate is increased, the number of the times of use of the substrate can be increased to provide great advantage to the production cost.

The porous layer was then formed in the grown silicon layer on the surface of the substrate by a method of so called anodization. That is, the substrate 800 and a platinum electrode with the same size (not shown in the drawings) were at first set opposite to each other at 5 cm gap and held in a tray (not shown) made of Teflon.

The tray was filled with a mixed liquid of hydrofluoric acid and ethanol and electric potential was applied to them while the substrate being set as anode for anodization to form a porous layer 801 in which fine pores with about several 100 Å in diameter were complicatedly entangled in the surface of the substrate. Subsequently, the substrate was heated to 1000 to 1100° C. in hydrogen flowing atmosphere and left for about 10 minutes to modify the surface of the porous layer.

Continuously, a $p^-$-type silicon layer was grown on the resultant surface. The apparatus shown in FIG. 5 was again employed for the growth. At first, the substrate holding means 502 were elevated to a load lock chamber 708 and a gate valve 710 was closed. The ambient gas in the load lock chamber 708 was replaced with nitrogen and the substrate was held by the substrate holding means 502.

Indium in which silicon was previously melted to be saturated at 950° C. was kept in the crucible 500. After that, the melt 501 was gradually cooled at −1° C./minute to make the melt oversaturated and when the melt was cooled to 935° C., the substrate was immersed in the melt 501 again to form a $p^-$-type silicon layer with 30 μm thickness for about 30 minutes. No melt 501 was found remaining on the substrate, on which the silicon layer growth was completed, by visual observation and, by way of caution, the substrate was immersed in hydrochloric acid to remove remaining metals. The grown silicon layer had approximately 1 Ωcm specific resistance. A described above, in order to obtain the practical growth rate, the growth had to be carried out at a temperature not lower than 750° C. Additionally, in the case of the growth on the porous layer thus prepared, no phenomenon that oxygen contained in the substrate became a cause of stacking faults at 750° C. or higher was observed. Supposedly, the grown silicon layer in which the porous layer is formed originally contained less oxygen then Cz-wafers. Next, a diffusing agent containing phosphorus was applied to the $p^-$-type silicon layer and the substrate was set in a diffusion furnace to carry out thermal diffusion at 800 to 1000° C. in nitrogen atmosphere, whereby the surface become a $n^+$-type silicon layer 803 to form a semiconductor junction.

Further, a silver paste was printed in a comb-like pattern on the surface and sintered to form a grid electrode 804. In order to suppress the surface recombination, a passivation layer (not shown in the drawings) was formed on the surface of the $n^+$-type silicon layer 803. After that, a transparent supporting member 805 of such as polycarbonate was stuck to the surface with a transparent adhesive 806.

Next, the porous layer 801 which was made fragile by formation of the fine pores was broken by applying force to the transparent supporting member 805 so as to peel off the member from the substrate and the $p^-$-type silicon layer was peeled off from the substrate. A back side electrode 807 was stuck to the back side of the peeled $p^-$-type silicon layer 802 by a conductive adhesive 808 to give a thin film crystal silicon solar cell.

Since the substrate from which the $p^-$-type silicon layer was peeled off could repeatedly be used by removing the remaining porous layer 801 by etching, a large number of thin film crystal silicon solar cell could be produced by using one substrate 800.

Generally, a Cz substrate, which is economical but contains oxygen in high content, is frequently used as the substrate 100. The Cz substrate has a moderately fragile, which is a specific property of a single crystal, and especially has an advantage that the substrate is hardly broken at the time when the porous layer 801 is broken by applying force and the $p^-$-type silicon layer 802 is peeled off from the substrate in the processes of producing the thin film crystal solar cell. On the other hand, as described above, since the processes of producing a thin film crystal silicon solar cell involved the process of heating the substrate at about 800 to 1100° C. in liquid-phase growth and thermal diffusion, oxygen existing in the substrate gradually appeared as defects.

In the case the defects appeared, at the time when anodization was carried out in the next step, the formation of the porous layer 801 was locally interfered and defects were caused in the $p^-$-type silicon layer 802 grown on the porous layer. For that, it was supposed that if one substrate 100 was repeatedly used, the characteristics of the produced thin film crystal silicon solar cell tended to be gradually deteriorated. In the case the method of the present invention was applied to the method for producing the substrate, the porous layer was formed by the anodization in the second silicon layer 103 with a low oxygen content, so that it was scarcely possible to cause defects attributed to oxygen even if the substrate 100 was repeatedly used.

Ten thin film crystal silicon solar cells were produced by repeating the steps shown in FIG. 6 using the substrate. The conversion efficiency of the solar cells were measured by using an AM1.5 solar simulator to find 15.0% for the solar cell produced at first time and 14.8% for that produced at 10th time and deterioration was scarcely observed.

For comparison, ten thin film crystal silicon solar cells were produced in accordance with the steps shown in FIG. 6, provided that a $p^+$-type Cz substrate with specific resistance of 0.01 Ωm was used and liquid phase growth was not previously carried out. In this case, the conversion efficiency was 14.8% for the solar cell produced at first time and 14.0% for that produced at 10th time and deterioration was apparently observed.

Further, instead of the porous layer 801, a hydrogen ion-implanted layer formed in a substrate having a liquid-phase epitaxial layer on its surface may be used for peeling off. The hydrogen ion implantation may be carried out by plasma ion implantation besides normal ion implantation methods.

As described above, the present invention makes it possible to grow a semiconductor layer with no defect even on an oxygen-containing substrate since a semiconductor layer is grown by bringing the substrate into contact with a melt at a temperature such that the number of defects due to oxygen is suppressed to be less than 1000/cm² on the surface of the substrate.

Also, the liquid-phase growth apparatus of the present invention comprises means for storing a melt, means for changing the temperature of the stored melt, and means for bringing an oxygen-containing substrate into contact with the melt, and make it possible to grow a defect-free semiconductor layer even on an oxygen-containing substrate by bringing the substrate into contact with the melt whose temperature is so controlled so as to suppress the number of defects on the surface of the substrate to be less than 1,000/cm².

More, the present invention makes it possible to grow a semiconductor layer with no defect even if the substrate surface is polluted since the pollutants are removed from the substrate before the growth of the semiconductor by bringing the substrate into a contact with a melt which is not saturated with the semiconductor material at first and then growing a first semiconductor layer after a metal solution is saturated with the semiconductor raw material.

What is claimed is:

1. A method for producing a semiconductor substrate, comprising the steps of:

growing a first silicon layer on a silicon substrate by liquid-phase growth at a temperature lower than 750° C.; and growing a second silicon layer on the first silicon layer by liquid-phase growth at a temperature not lower than 750° C.

2. The method according to claim 1, wherein the silicon substrate is a CZ silicon wafer.

3. The method according to claim 1, wherein the growth of the first silicon layer is carried out at a temperature not lower than 500° C.

4. A solar cell produced by a method of claim 1 comprising a step of anodizing a surface of first and second silicon layer side of the semiconductor substrate of claim 1.

5. A liquid-phase growth apparatus for producing a semiconductor substrate according to claim 1, which comprises:

means for storing a melt in which silicon is melted;

means for changing a temperature of the melt;

a holding member for simultaneously holding a semiconductor material to be dissolved in the melt and the silicon substrate; and means for transporting the holding member up and down.

6. A liquid-phase growth method for growing a semiconductor layer on a substrate containing oxygen, which comprises growing a first semiconductor layer by bringing the substrate into contact with a melt at a temperature such that defects due to the oxygen are suppressed to be less than 1000/cm² on a surface of the substrate.

7. The liquid-phase growth method according to claim 6, wherein a second semiconductor layer is further grown by increasing a temperature of the melt after the first semiconductor layer is grown to a thickness which does not cause defects due to the oxygen on a surface of the first semiconductor layer.

8. The liquid-phase growth method according to claim 7, wherein a thickness of the first semiconductor layer is 0.01 μm or more.

9. The liquid-phase growth method according to claim 7 or 8, wherein the first semiconductor layer has the same conductivity type as that of the second semiconductor layer and a dopant concentration larger than that of the second semiconductor layer.

10. A solar cell comprising a first semiconductor layer produced by a liquid-phase growth method according to claim 6 or 7.

11. A solar cell comprising a semiconductor layer grown on the first semiconductor layer produced by a liquid-phase growth method according to claim 6 or 7.

12. The liquid-phase growth method according to claim 6, wherein the temperature is controlled to be lower than 750° C. when silicon is used for a material of the substrate.

13. The liquid-phase growth method according to claim 6, wherein a third semiconductor layer is grown on the first semiconductor layer by growing the first semiconductor layer grown to a thickness which does not cause defects due to oxygen on a surface of the first semiconductor layer and then taking the substrate out of the melt and further bringing the substrate into contact with another melt.

14. The liquid-phase growth method according to claim 6, wherein the substrate is produced by the Czochralski method.

15. A method for producing an epitaxial substrate, which comprises using a first semiconductor layer produced by a liquid-phase growth method according to claim 6 as an epitaxial layer.

16. The liquid-phase growth method according to claim 6, wherein the first semiconductor layer is grown by bringing the substrate into contact with a melt unsaturated with a semiconductor raw material to remove pollutants on a surface of the substrate and then saturating the semiconductor raw material of the melt with a metal solution.

17. A liquid-phase growth apparatus comprising:

means for storing a melt;

means for changing a temperature of the stored melt; and means for bringing an oxygen-containing substrate into contact with the melt, wherein temperature control means for the melt is provided to control the melt to a temperature such that a number of defects on the surface of the substrate is suppressed to be less than 1,000/cm² and a first semiconductor layer is grown by bringing the substrate into contact with the melt.

18. A liquid-phase growth apparatus comprising:

means for storing a melt;

means for changing a temperature of the stored melt; and means for bringing an oxygen-containing substrate into contact with the melt, wherein the substrate is brought into contact with the melt at a temperature such that a number of stacking faults in a semiconductor layer grown on a surface of the substrate are suppressed to be less than 1,000/cm².

* * * * *

UNITED STATES PATENT AND TRADEMARK OFFICE
CERTIFICATE OF CORRECTION

PATENT NO. : 6,566,277 B1
DATED : May 20, 2003
INVENTOR(S) : Nakagawa et al.

It is certified that error appears in the above-identified patent and that said Letters Patent is hereby corrected as shown below:

Title page,
Item [56], References Cited, FOREIGN PATENT DOCUMENTS, add
-- JP 58-15218 1/1983 --.

Column 15
Claim 4, should read as follows:

--A solar cell produced by the method of claim 1, wherein a surface of a first and second silicon layer side of the semiconductor substrate is anodized.--.

Column 16,
Claim 16, should read as follows:

--A liquid-phase growth apparatus comprising:
   means for storing a melt;
   means for changing a temperature of the stored melt; and
   means for bringing an oxygen-containing substrate into contact with the melt,
      wherein temperature control means for the melt is provided to control the melt to a temperature such that a number of defects due to oxygen on the surface of the substrate is suppressed to be less than $1,000/cm^2$ and a first semiconductor layer is grown by bringing the substrate into contact with the melt.--.

Claim 18, should read as follows:

Claim 18 should read as follows:
--A liquid-phase growth apparatus for producing a semiconductor substrate, which comprises:
   means for storing a melt in which silicon is melted;
   means for changing a temperature of the melt;
   a holding member for simultaneously holding a semiconductor material to be dissolved in the melt and a silicon substrate; and
   means for transporting the holding member up and down,
      wherein a first silicon layer is grown on the silicon substrate by liquid-phase growth at a temperature lower than 750°C, and a second silicon layer is grown on the first silicon layer by liquid-phase growth at a temperature not lower than 750°C.--.

UNITED STATES PATENT AND TRADEMARK OFFICE
CERTIFICATE OF CORRECTION

PATENT NO. : 6,566,277 B1
DATED : May 20, 2003
INVENTOR(S) : Nakagawa et al.

It is certified that error appears in the above-identified patent and that said Letters Patent is hereby corrected as shown below:

Add Claims 19 to 28 to read as follows:

-- 19. The liquid-phase growth apparatus according to claim 16, wherein a second semiconductor layer is further grown by increasing a temperature of the melt after the first semiconductor layer is grown to a thickness which does not cause defects due to the oxygen on a surface of the first semiconductor layer.

20. The liquid-phase growth apparatus according to claim 16, wherein a thickness of the first semiconductor layer is 0.01 $\mu$m or more.

21. The liquid-phase growth apparatus according to claim 17 or 18, wherein the first semiconductor layer has the same conductivity type as that of the second semiconductor layer and a dopant concentration larger than that of the second semiconductor layer.

22. The liquid-phase growth apparatus according to claim 16, wherein the temperature is controlled to be lower than 750°C when silicon is used for a material of the substrate.

23. The liquid-phase growth apparatus according to claim 16, wherein a third semiconductor layer is grown on the first semiconductor layer by growing the first semiconductor layer grown to a thickness which does not cause defects due to oxygen on a surface of the first semiconductor layer and then taking the substrate out of the melt and further bringing the substrate into contact with another melt.

24. The liquid-phase growth apparatus according to claim 16, wherein the substrate is produced by the Czochralski method.

25. The liquid-phase growth apparatus according to claim 16, wherein the first semiconductor layer is grown by bringing the substrate into contact with a melt unsaturated with a semiconductor raw material to remove pollutants on a surface of the substrate and then saturating the semiconductor raw material of the melt with a metal solution.

26. A liquid-phase growth apparatus comprising:
means for growing a first silicon layer on a silicon substrate by liquid-phase growth at a temperature lower than 750°C; and
means for growing a second silicon layer on the first silicon layer by liquid-phase growth at a temperature not lower than 750°C.

UNITED STATES PATENT AND TRADEMARK OFFICE
CERTIFICATE OF CORRECTION

PATENT NO. : 6,566,277 B1
DATED : May 20, 2003
INVENTOR(S) : Nakagawa et al.

It is certified that error appears in the above-identified patent and that said Letters Patent is hereby corrected as shown below:

27. The liquid-phase growth apparatus according to claim 26, wherein the silicon substrate is a CZ silicon wafer.

28. The liquid-phase growth apparatus according to claim 26, wherein the growth of the first silicon layer is carried out at a temperature not lower than 500°C.--.

Signed and Sealed this

Ninth Day of March, 2004

JON W. DUDAS
*Acting Director of the United States Patent and Trademark Office*